United States Patent [19]

Orban

[11] Patent Number: 4,525,857
[45] Date of Patent: Jun. 25, 1985

[54] CROSSOVER NETWORK

[75] Inventor: Robert A. Orban, Belmont, Calif.

[73] Assignee: Orban Associates, Inc., San Francisco, Calif.

[21] Appl. No.: 646,793

[22] Filed: Sep. 4, 1984

Related U.S. Application Data

[62] Division of Ser. No. 480,921, Mar. 31, 1983, Pat. No. 4,495,643.

[51] Int. Cl.³ .............................................. H03G 5/00
[52] U.S. Cl. .................................................. 381/100
[58] Field of Search ................... 381/62, 99, 100, 101; 333/132, 134, 28 T; 369/175

[56] References Cited

U.S. PATENT DOCUMENTS 4,208,548  6/1980  Orban .................................... 381/94

OTHER PUBLICATIONS

"Delay Lines Help Generate Quadrature Voice for SSB", Electronics, Apr. 13, 1978, by Webb and Kelly.
"Decomposition of Nonlinear Operators into 'Harmonic' Components, with Applications to Audio Signal Processing", Electronics Letters, Jan. 8, 1976, by M. A. Gerzon.
"A Family of Linear-Phase Crossover Networks of High Slope Derived by Time Delay", by Lipshitz and Vanderkooy, a paper presented at the 69th Convention of the Audio Engineering Society, (May 12-15), 1981 at Los Angeles, CA.

Primary Examiner—Forester W. Isen
Attorney, Agent, or Firm—Blakely, Sokoloff, Taylor & Zafman

[57] ABSTRACT

A peak limiter is described which employs the Hilbert transform. Effectively distinct processing occurs for low frequency and high frequency signals and harmonic distortion results only when the limiter is excited by high frequencies.

4 Claims, 7 Drawing Figures

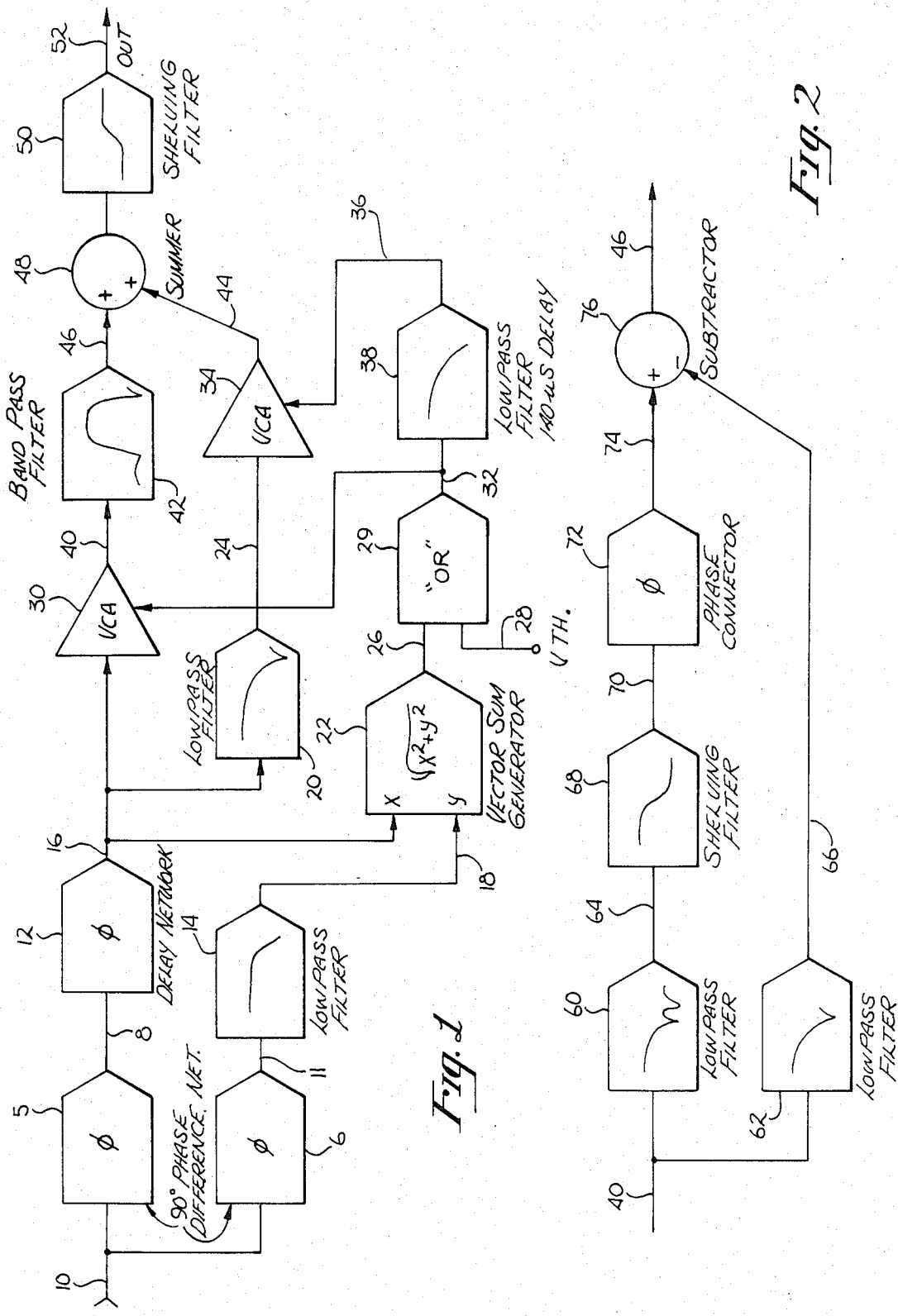

CROSSOVER NETWORK

This is a divisional of application Ser. No. 480,921 filed Mar. 31, 1983, now U.S. Pat. No. 4,495,643.

BACKGROUND OF THE INVENTION

1. Field of the Invention.

The invention relates to the field of audio peak limiters.

2. Prior Art.

Many techniques are used for peak limiting of signals including audio frequency signals. Among them are fast-attack, slow-release automatic gain control (AGC) amplifiers, diode audio-frequency clippers, diode radio-frequency clippers, and fast-attack slow-release AGC amplifiers employing delay lines. Each technique has its own audible, subjective strengths and weaknesses.

Particularly when combined with delay line techniques, AGC techniques can be configured to have no audible harmonic or intermodulation distortion. However, they avoid such distortion by using relatively little non-linear modification of the audio waveform. Because such a system only senses peak level (which has little or no correlation with loudness), if the peak-to-RMS ratio of the signal varies significantly, then highly unnatural loudness variations (sometimes called "pumping" and "hole-punching") can result.

Audio frequency clippers are extremely simple: a pair of back-to-back zener diodes which simply clip off any peaks exceeding a given threshold is one example. This technique can severely modify the audio waveform in a non-linear way, producing audible harmonic and/or intermodulation (IM) distortion when used to excess. However, because this technique acts only on instantaneous peaks, it causes no significant loudness variation and is therefore frequently used. Generally clipping is preceded by automatic level control circuitry designed to control the amount of distortion produced by the clipping thereby limiting distortion to inaudible (or at least esthetically acceptable) levels. U.S. Pat. No. 4,208,548 discloses a system for controlling the amount of distortion produced by an audio frequency clipper.

The radio frequency (RF) clipper has proven popular for processing voice signals in shortwave and communications applications. Here, the audio frequency signal is modulated into a single-sideband suppressed-carrier RF signal. This RF signal is clipped and the clipped signal is then demodulated. An interesting property of this technique is that no harmonic distortion is produced with a pure tone, since the first harmonic produced by the clipping is located at an integral multiple of the RF carrier frequency. If the carrier frequency is 1 MHz, the harmonics occur at 2 MHz, 3 MHz, etc. These harmonics are eliminated upon demodulation and ordinary filtering. (Upon demodulation, the 2 MHz harmonic becomes 1 MHz: still well outside the audio range.)

Unfortunately, with ordinary program material (consisting of many frequencies simultaneously), RF clipping can produce IM distortion which is even more severe than that produced by audio frequency clipping. The peak level of the output must be instantaneously constrained to a given level, thus causing the distortion. If no harmonic distortion is permitted, the waveform modification necessary to control the peak level must be entirely at the expense of added IM distortion. Subjectively, this technique sounds far better than audio frequency clipping on voice and substantially worse than audio frequency on music. This is because when voice is clipped, the objectionable audible distortion is primarily *harmonic* distortion in the frequency range above the fundamental frequencies of voice. These harmonics fall in the frequency range to which the ear is most sensitive (1–5 kHz), and in which there is little naturally-occurring energy in voice to mask such harmonics. Accordingly, the harmonic-distortion suppression properties of the RF clipper are very useful for voice.

In contrast, most music is much denser spectrally than is voice. Harmonic distortion can often add a pleasing brightness to music because the harmonics are harmoniously related to the music, and because naturally-occurring harmonics tend to mask the addition of moderate amounts of added harmonic distortion. But IM distortion is not harmonious, and therefore always degrades the subjective quality of music. Therefore, audio frequency clipping (particularly very "hard" clipping characterized by a highly linear transfer curve up to the clipping threshold) tends to sound better than RF clipping on most music. Exceptions occur with instruments having simple spectra with few high-frequency components to mask unnaturally-induced harmonics. Examples of such instruments are grand piano, harp, nylon-stringed acoustic guitar, and fender-Rhodes electric piano.

The present invention behaves like an RF clipper below a certain frequency (4 kHz in the preferred embodiment), and like an audio frequency clipper above this frequency. Accordingly, no harmonic distortion is produced by input material below 4 kHz and the advantages of RF clipping are achieved on voice. "dull-sounding" instruments, and other such program material with little naturally-occurring high frequency energy to mask harmonic distortion. Conversely, in the case of most music (particularly in a system employing high frequency preemphasis, such that peak limiting must be effected *after* such preemphasis), most of the energy to be controlled by the peak limiter is usually located above 4 kHz. By processing this frequency band with the equivalent of audio frequency clipping, minimum difference-frequency IM distortion (which is particularly objectionable when listened to after high-frequency deemphasis in a receiver) is obtained.

The closest prior art known to Applicant is that shown in an article entitled "Decomposition of Nonlinear Operators into 'Harmonic' Components, with Applications to Audio Signal Processing", *Electronics Letters*, Vol. 12, No. 7, pp. 23–24 (Jan. 8, 1976) by M. A. Gerzon, (hereinafter referred to as "the Gerzon article"). With respect to the crossover network of FIG. 6 of this application, the closest prior art known to Applicant is "A Family of Linear-Phase Crossover Networks of High Slope Derived by Time Delay", by Lipshitz and Vanderkooy, a paper presented at the 69th Convention of the Audio Engineering Society (May 12–15, 1981 at Los Angeles, Calif).

SUMMARY OF THE INVENTION

The limiter of the present invention performs an audio peak limiting function. The limiter effectively provides radio frequency clipping of low frequencies and audio frequency clipping of high frequencies. Thus, little or no harmonic distortion occurs for voice whereas harmonic distortion is permitted for high frequency signals. In the preferred embodiment the input signal is separated into two signals with 90 degrees phase difference between the signals. That is, one signal is the Hilbert transform of the other. The high frequency components are removed from one of the signals. Both signals are coupled to a vector sum generator, the output of which is "ORed" in a thresholding means. The output of the thresholding means provides a control signal for controlling the gain of a voltage-controlled amplifier. This amplifier is coupled to receive the audio signal. The vector sum generator with the resultant control signal provides the functional equivalent of radio frequency clipping for the low frequency components of the audio signal. The exclusion of the high frequency components from one of the inputs to the vector sum generator prevents radio frequency clipping of the high frequency components. The limiter for the high frequency components operates as a feedforward circuit with infinite compression ratio limiting using instantaneous attack and release times which is equivalent to an ordinary audio frequency clipper.

BRIEF DESCRIPTION OF THE DRAWINGS

FIG. 1 is a block diagram illustrating one presently preferred embodiment of the limiter of the present invention.

FIG. 2 is a block diagram illustrating the preferred embodiment for the bandpass filter of FIG. 1.

DETAILED DESCRIPTION OF THE INVENTION

Figures 3A, 3B:
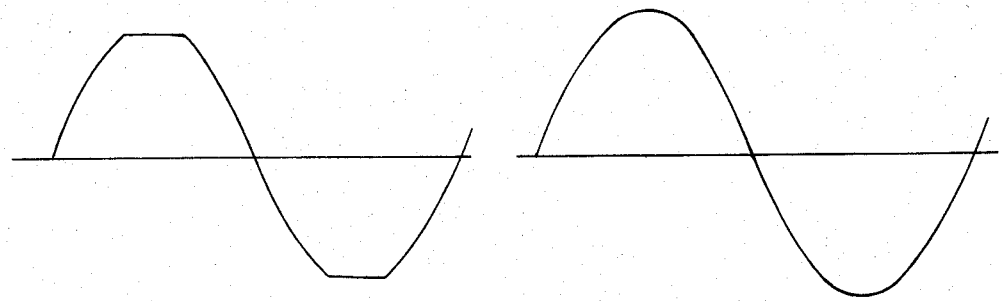
FIG. 3a is a waveform used to explain the operation of the limiter of FIG. 1.
FIG. 3b is a waveform used to explain the operation of the limiter of FIG. 1.

An audio peak limiter embodying a Hilbert transform generator is described. In the following description, numerous specific details are set forth such as specific frequencies, etc. It will be obvious to one skilled in the art, however, that the present invention may be practiced without these specific details. In other instances, well-known circuits have been shown in block diagram form in order not to unnecessarily obscure the present invention.

The present invention implements a Hilbert transform to help achieve the equivalent of radio frequency clipping. Such clipping is used for the low frequency components of the audio signal without actual use of RF modulation and demodulation. For a discussion of the implementation of this transform for a signal processing system, see the Gerzon article, particularly see FIG. 2(b) of that article. The Hilbert transform has also been employed to help generate single-sideband signals. See, for instance, "Delay Lines Help Generate Quadrature Voice for SSB", *Electronics*, Apr. 13, 1978, beginning at p. 115 by Webb and Kelly.

Referring to FIG. 1, an input audio signal on line 10 is coupled to phase difference networks 5 and 6. These networks provide audio signals at their outputs (lines 8 and 11, respectively) which are 90 degrees out of phase. The signal on line 11 is the Hilbert transform of the signal on line 8. The signal on line 11 is passed through a lowpass filter 14 which is the presently preferred embodiment has cutoff frequency of approximately 4 kHz. (A 5th order Chebychev filter with a 0.1dB passband ripple is currently preferred.) A delay network 12 receives the output from the network 5 (line 8) and provides a phase shift to match the phase shift of the filter 14. A phase match of approximately $+$ or $-1.5$ degrees is currently preferred, although performance is somewhat improved by more accurate matching. The difference networks 5 and 6, delay network 12 and lowpass filter 14 are sometimes hereinafter referred to as the "input means".

Note the signal on line 18 does not include the high frequency components of the audio signal. This is quite distinct from the teachings of Gerzon where a single frequency band is employed throughout.

In the input means the filter 14 may be placed before the difference network 6, and also the delay network 12 may be placed before the difference network 5. Moreover, the phase difference of 90 degrees between the outputs of networks 12 and 14 need be accurately maintained only in the frequency range where filter 14 produces significant response instead of throughout the entire frequency range processed by the peak limiter of FIG. 1. (In a typical application, the input audio signal on line 10 is first passed through a highpass filter with, for instance, a 30 Hz cutoff.)

The vector sum generator 22 receives the signal on line 16 and line 18. The magnitude of these signals are squared, summed and the output on line 26 represents the square root of this sum.

A thresholding circuit 29 for analog ORing is used. The circuit 29 provides, as its output on line 32, the greater of the signal on line 26 or a predetermined constant voltage threshold applied on line 28. The signal on line 32 provides a control signal for controlling the gain of the voltage-controlled amplifier (VCA) 30. (Also this signal, after passing through lowpass filter 38 provides a gain control signal for VCA 34.) The VCA 30 receives audio signals (all frequency components) from line 16.

The VCA 30 has a gain which is inversely proportional to the signal on line 32. The square root function within the generator 22 can be eliminated if the gain of the VCA 30 (and VCA 34) has a response which is inversely proportional to the square of the signal on line 32.

If the gain of VCA 30 is inversely proportional to the signal on line 32 for the vector sum generator shown in FIG. 1, then VCA 30 provides the functional equivalent of radio frequency clipping for the low frequency components of the audio signal. This is represented by the waveform in FIG. 3b, more specifically, an undistorted sinewave because no harmonic distortion is produced and no IM distortion is possible for a single tone. The lack of distortion in FIG. 3b can be explained by recalling the trigonometric identity $\sqrt{\sin^2 74 + \cos^2 \theta} = 1$. This is what is computed by the vector sum generator 22. Since the output of the generator 22 is thus a constant, the control voltage on line 32 is also constant and no distortion is generated by VCA 30.

It can be shown that if line 18 is disconnected from the vector sum generator 22, then the signal on line 40 is an audio frequency clipped signal. In this case, the signals on lines 16 and 26 are identical and a "feedforward" infinite-compression-ratio limiter with instantaneous attack and release times is realized. This is equivalent to a simple audio frequency clipper. A sinewave for this audio frequency clipper which exceeds the threshold on line 28 is shown in FIG. 3a.

The signal on line 40 thus has the characteristics of an radio frequency clipped signal for all signals below the cutoff frequency of filter 14, and has the characteristics of an audio frequency clipped signal for all signals in the frequency range producing negligible outputs from filter 14. In the transition region of filter 14, the output on line 18 is characterized by more and more harmonic distortion (and less and less IM distortion, in the case of two or more frequencies) as the signal on line 18 becomes smaller and smaller with increased frequency.

It is desirable that the peak levels on line 40 be the same for all frequencies (both above and below the cutoff frequency of filter 14). To assure this, the gain of filter 14 does not exceed the gain of network 12, and the 90 degree phase relationship between the signals on line 16 and 18 is maintained throughout all frequencies for which there is a significant output from filter 14. For accurate RF clipping, the gain between the input signal on line 10 and the signal on line 16 should be the same as the gain between the signal on line 10 and the signal on line 18.

For the above-described system, filters 20 and 38, VCA 34, bandpass filter 42, summer 48 and shelving filter 50 are not required.

An additional reduction in IM distortion can be achieved with additional components which more closely follow the teachings of the Gerzon article. A delay network identical to network 12 is coupled to receive the signal on line 11. The output of this added network is connected to an additional VCA which is controlled by the voltage on line 32. As in the Gerzon article, the output of this additional VCA is applied to one input terminal of another 90 degree phase difference network and the output of the VCA 30 is applied to the other input terminal of this phase difference network. The two outputs of this phase difference network are summed and this summation is the peak limited signal. This adds considerable complexity to the system and provides little advantage and moreover, requires the 90 degree phase difference network to have a constant time delay to avoid distorting the peak levels. While this is possible (see above-referenced Webb and Kelly article), it is quite expensive, particularly where a bucket brigade device or charge coupled device delay lines are employed. (A digital realization could also be fabricated. However, with current costs of digital circuits, this realization would be even more expensive than an analog system.)

Figure 5:
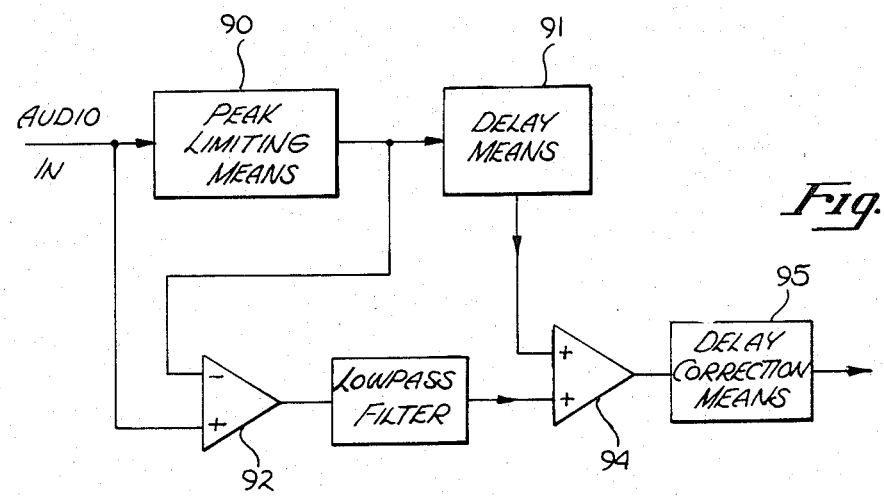
FIG. 5 is a copy of FIG. 9 of U.S. Pat. No. 4,208,548. This figure is shown in this application since it is discussed in conjunction with the present invention.

The above-described portions of FIG. 1 (without filters 20 and 38, VCA 34, bandpass filter 40, summer 48, and shelving filter 50) can be refined employing the distortion-cancellation teachings of U.S. Pat. No. 4,208,548 (hereinafter '548 patent). The peak limiting means 90 of FIG. 5 (FIG. 9 of the '548 patent) can be replaced by the VCA 30 of FIG. 1; the input to peak limiting means 90 would be line 16. In this manner, the IM distortion-cancellation as described in the '548 patent would be obtained, although the output from amplifier 94 would have poorly controlled peak levels when compared with the control achieved by the present invention.

Consider a 100 Hz tone applied to the input (line 16) at a level requiring 10 dB of peak reduction. With the present invention, this gain reduction would occur without introducing harmonic distortion since 100 Hz is well within the range of the radio frequency clipping. However, the output of the differential amplifier 92 of FIG. 5 must be considered. If the two inputs to this amplifier are a pair of 100 Hz tones with 10 dB difference in level (due to the fact that the gain of VCA 30 is −10 dB), the amplifier's output will be 6.7 dB *above* the output level of peak limiting means 90. When this is added back into the signal, in the amplifier 94 of FIG. 5, a full 10 dB overshoot will occur and thus the effect of the gain reduction will be cancelled. An additional overshoot correction will now be required or safety clipping employed, creating distortion. These problems are overcome in FIG. 1 of the present invention by including VCA 34, filters 20, 38, and 42, and summer 48 which provide distortion cancellation.

Referring again to FIG. 1, the signal on line 16 is coupled to a second VCA 34 through a lowpass filter 20 (line 24). VCA 30 is matched to VCA 34 so that the gains will accurately track if the same control signal is applied to both amplifiers. The output of the threshold circuit 29 is coupled through a lowpass filter 38 which may be a 12 dB per octave Bessel filter with approximately 140 $\mu$sec. delay. The output of filter 38, line 36, provides a control signal for VCA 34. Filter 38 removes the sharp "corners" in the control voltage making it less likely that audible distortion will occur when modulating the audio signal. Unfortunately, this distortion reduction causes peaks to overshoot at the output of the VCA 34. In particular, if a full bandwidth audio signal is applied, there are many high frequency overshoots. Filter 20 smooths the input to VCA 34, minimizing output overshoots which would otherwise occur from the smoothed control signal applied to VCA 34.

Referring back once again to FIG. 5, VCA 34 can be considered to be in series with the "+" input of the amplfier 92. Recalling the 100 Hz example discussed above, it can now be seen that because the control voltage is perfectly smooth in this case (no distortion is produced on the sinewave at 100 Hz), filter 38 does not modify the control signal applied to VCA 34. The control signal on lines 32 and 36 are identical and the gains ofVCA 30 and 34 are identical as well. The signals at both input terminals of amplifier 92 are therefore identical, and no output is produced at the output of amplifier 92. The level at the output of amplifier 94 is therefore not disturbed, there are no overshoots, and the undistorted RF clipping again is fully preserved.

With complex program material, the situation is more difficult to understand because the control signal is no longer constant. Filter 38 introduces a 140 $\mu$sec. time delay into the control signal on line 36 (some time delay is an inevitable side effect of lowpass filtering). Compensation for this time delay must be introduced into the audio path to assure accurate distortion cancellation. Such additional time delays are provided by filters 20 and 42. Filter 20 delays the input to VCA 34 by 140 $\mu$sec., this corresponding to the delay associated with filter 38. Thus, both audio and control input signals to VCA 34 are delayed by identical amounts of time. Since the output of VCA 30 precedes the output of VCA 34 by 140 $\mu$sec., it must be delayed 140 $\mu$sec. as well. This is done in a highpass filter or a bandpass filter 42. In this way, all the audio signals arrive at summing amplifier 48 at the same time, that is, with 140 $\mu$sec. delay.

It is interesting to note the manner in which distortion cancellation is effected. Note first that the control voltage to VCA 34 is sufficiently smooth to essentially eliminate audio distortion from VCA 34's output (line 44). The only audibly significant difference-frequency IM distortion produced by the system is produced by VCA 30. Therefore, to eliminate all low frequency IM distortion produced by the limiter, the output of VCA 30 is highpassed or bandpassed. In the presently preferred embodiment, a bandpass filter 42 is employed, eliminating all low frequency components from VCA 30's output.

Filters 20 and 42 together form a constant-delay phase-linear crossover network with steep slopes. Realization of such filters may be difficult, however, a realization is described in conjunction with FIG. 2. In FIG. 2, filter 42 is shown as comprising filters 60 and 68, phase corrector 72, lowpass filter 62 and a subtractor 76. The input to the network of FIG. 2 is line 40; this being the input to the filter 42 of FIG. 1. The output of the subtractor of FIG. 2, line 46 corresponds to the output of the filter 42 of FIG. 1.

In FIG. 2, the filters 60 and 68 and phase corrector 72 are all linear, and thus, may be placed in any order. The cascade of filter 60 and phase corrector 72 may be either realized as a constant-delay lowpass filter where the output of the system is to be band limited, or an allpass network approximating constant delay if system bandwidth limitation is not required. In this case, filter 60 is eliminated, and the phase corrector 72 becomes the constant-delay allpass network. However, a bandwidth limitation is generally desired for broadcast or communication applications, making filter 42 of FIG. 1 a bandpass filter as opposed to a highpass filter.

The low frequency cutoff of the network of FIG. 2 (filter 42 of FIG. 1) is created by subtracting the output of the lowpass filter 62 from the output from the path comprising lowpass filter 60, shelving filter 68 and the corrector 72 at the subtractor 76. The delay in this upper path is selected to match the delay in the filter 62, which itself is designed to have approximately constant delay in its passband. Shelving filter 68 is fabricated to match the amplitude response in this upper path to the high frequency rolloff characteristics of the filter 62. This operation is described in FIG. 10 of the '548 patent. A complementary shelving filter 50 is placed at the output of summer 48 of FIG. 1 to restore a flat response to the output signal on line 52.

To understand the operation of the system, it should be noted that filters 20 and 62 of FIGS. 1 and 2 have identical responses. Assume first that the gain in the VCAs 30 and 34 are the same, then the signals on lines 44 and 66 (FIGS. 1 and 2, respectively) will also be identical since the signals pass through identical filters. However, the contribution on line 66 is subtracted before the final output while the contribution on line 44 is added. Therefore, in the case of identical VCA gains, these signals will cancel completely, leaving the overall frequency response of the system identical to the frequency response through filters 60, 68, corrector 70 and the complementary shelving filter 50. This response will have either a lowpass or allpass characteristic depending upon whether filter 60 is used (i.e., depending upon whether the system output is to be bandwidth-limited).

In typical operation, the gains of the VCAs 30 and 34 are almost identical. The gains differ only for brief transients caused by the response of the lowpass filter 38, which as previously mentioned, is employed to prevent introduction of audible IM distortion. Thus, distortion-free but gain-controlled low frequencies (containing some overshoots) pass to line 44 (output of VCA 34) while peak controlled high frequencies pass through filter 42. The summation on line 52 contains essentially no IM distortion in the low frequency band but contains some overshoots due to the overshoots inherent in the combination of filters 60 and 72 of FIG. 2, and because of overshoots on line 44. An overshoot corrector should be employed to correct for these overshoots. This corrector can be a simple audio frequency clipper or where better bandwidth control is desired, can employ the overshoot protection circuit techniques described in U.S. Pat. No. 4,249,042.

Additional distortion reduction for the system of FIG. 1 can be achieved by operating in quadrature throughout the entire system and more fully following the teachings of the Gerzon article. This is shown in FIG. 4.

Figure 4:
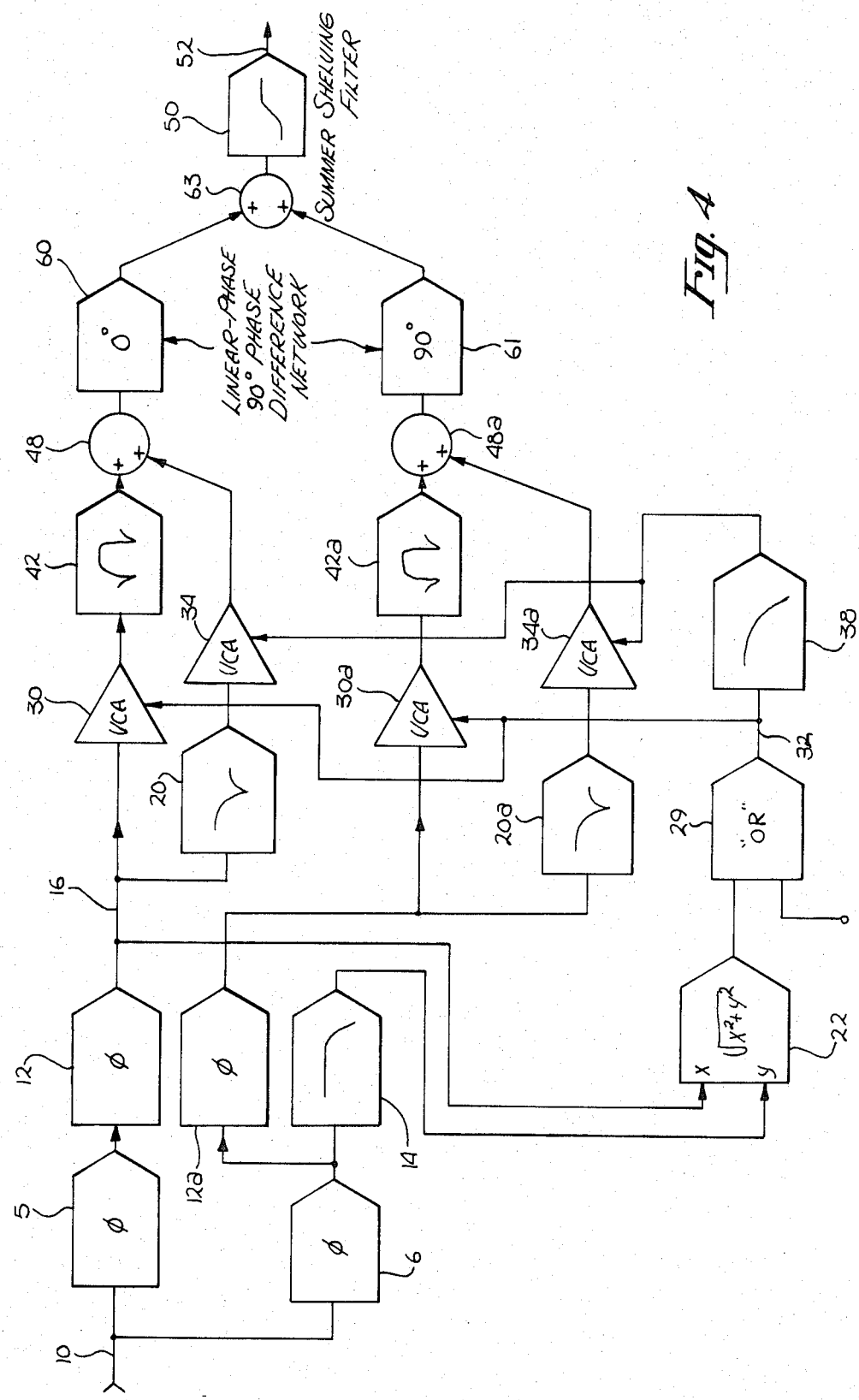
FIG. 4 is a block diagram illustrating another preferred embodiment of the present invention where a second processing path is also employed.

In FIG. 4 corresponding components and lines to those of FIG. 1 have been numbered with the same numerals. The added identical components within FIG. 4 have been shown with a letter prefix. For instance, the delay network 12a of FIG. 4 is identical to the delay network 12 of FIGS. 1 and 4. This is also true for the lowpass filter 20a, VCAs 30a and 34a, bandpass filter 42a, and summer 48a. The output of the summers 40 and 48a are coupled through the 90 degree phase difference networks 60 and 61, and the output of these networks are summed in a summer 63. The output of the summer 63 is then coupled to a shelving filter 50; this filter having the complementary response to the shelving filter 68 of FIG. 2, as previously mentioned.

The realization of Filter 42 as shown in FIG. 2 in combination with the filter 20 of FIG. 1, as mentioned, form a constant-delay phase linear crossover network with steep slopes. This network is useful for a crossover system for loudspeakers. (Note that the crossover frequency is determined by the lowpass filters 20 and 62 and thus, a crossover frequency can be selected which is different than the frequency bands caused by the lowpass filter 14.) Such a crossover network is shown in FIG. 6.

Figure 6:
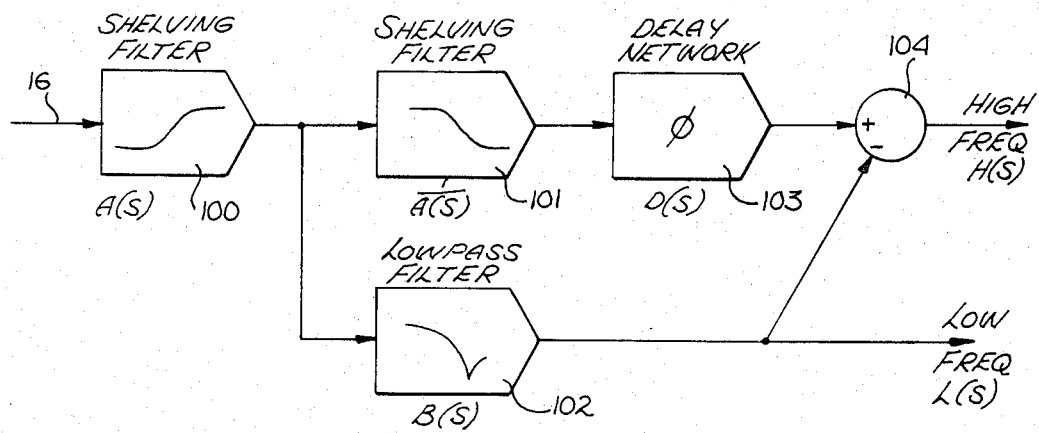
FIG. 6 is a block diagram of a portion of the circuit of FIGS. 1 and 2 which may be used as a crossover network.

In FIG. 6, the input audio signal on line 16 is shown coupled to a first shelving filter 100. The output of the shelving filter is coupled to the input of a complementary shelving filter 101 and a lowpass filter 102. The output of filter 101 is coupled to a delay network 103 with the output of this network being coupled to the plus terminal of a subtractor 104. The output of lowpass filter 102 is coupled to the minus terminal of the subtractor 104. The high frequency components are present at the output of the subtractor 104 and the low frequency components at the output of the lowpass filter 102. The embodiment illustrated in FIG. 6 provides non-band limited signal. If the delay network 103 is replaced with the cascade of a lowpass filter and phase corrector (to provide linear phase), a band limited crossover network is realized.

The network of FIG. 6 provides a flat summation of the lowpass and highpass outputs as shown by the equations below; where A(s), B(s), D(s), H(s), and L(s) are transfer functions of s, a complex variable:

$$H(s) = A(s)\left[\frac{D(s)}{A(s)} - B(s)\right] = D(s) - A(s)B(s)$$

$$L(s) = A(s)\ B(s)$$

Thus, $H(s) + L(s) = D(s)$, a constant time delay.

With the embodiment of FIG. 6, an essentially linear-phase lowpass filter 102 can be used while still achieving high slopes. Note that in this configuration, shelving filter 101 in series with the delay network 103, provides a non-flat response which is not normally perceived as being useful in a crossover network, but which is put to use in the embodiment of FIG. 6.

Thus, a peak limiting system has been disclosed which acts as a radio frequency clipper for low frequencies, and an audio frequency clipper for high frequencies. The output level of the system is precisely controlled for all frequencies including the transition frequencies between the low frequency and high frequency bands which are selected. In the full system of FIG. 1, the audio signal is divided into two frequency bands (not necessarily the same as the low frequency and high frequency bands used for the radio frequency and audio frequency clipping) for distortion cancellation. The difference-frequency IM distortion produced is substantially eliminated, however, some overshoots beyond the desired peak output level occur.

While in the presently preferred embodiment, the entire system is realized with analog circuits, portions or all of the above systems can be realized with digital circuits. However, it is believed that with the current cost and speed of digital circuits, a digital realization would be more expensive than an analog realization.

I claim:

1. A crossover network for an audio signal comprising:
   a first shelving filter for receiving said audio signal;
   a second shelving filter coupled to the output of said first shelving filter;
   a lowpass filter coupled to the output of said first shelving filter;
   a delay network coupled to the output of said second shelving filter;
   subtracting means for subtracting two signals coupled to the output of said delay network and said lowpass filter;
   whereby a crossover network is realized with the high frequency band being present at the output of said subtraction means and the low frequency band at the output of said lowpass filter.

2. The crossover network defined by claim 1 wherein said first and second shelving filters have reciprocal characteristics.

3. A band limited crossover network for an audio signal comprising:
   a first shelving filter receiving said audio signal;
   a second shelving filter coupled to the output of said first shelving filter;
   a first lowpass filter coupled to the output of said first shelving filter;
   a second lowpass filter and a phase corrector coupled to the output of said second shelving filter;
   subtracting means for subtracting two signals coupled to the output of said second lowpass filter and phase corrector and said first lowpass filter;
   whereby a band limited crossover network is realized with a high frequency band being present at the output of said subtraction means and low frequency band being present at the output of said first lowpass filter.

4. The crossover network defined by claim 3 wherein the first and second shelving filters have reciprocal characteristics.

* * * * *

UNITED STATES PATENT AND TRADEMARK OFFICE
CERTIFICATE OF CORRECTION

PATENT NO. : 4,525,857
DATED : June 25, 1985
INVENTOR(S) : Orban

It is certified that error appears in the above-identified patent and that said Letters Patent is hereby corrected as shown below:

| COLUMN | LINE | DESCRIPTION |
|---|---|---|
| 4 | 57 | Delete "$\sqrt{\sin^2_{74} + \cos^2_\theta} = 1$" and insert --$\sqrt{\sin^2_\theta + \cos^2_\theta} = 1$-- |

Signed and Sealed this

Fourteenth Day of April, 1987

*Attest:*

DONALD J. QUIGG

*Attesting Officer*  *Commissioner of Patents and Trademarks*